US009182772B2

(12) United States Patent
Uota et al.

(10) Patent No.: US 9,182,772 B2
(45) Date of Patent: Nov. 10, 2015

(54) POWER DEVICE CONTROL CIRCUIT AND POWER DEVICE CIRCUIT

(71) Applicants: Shiori Uota, Tokyo (JP); Takahiro Inoue, Tokyo (JP); Koji Tamaki, Fukuoka (JP); Shoichi Orita, Tokyo (JP)

(72) Inventors: Shiori Uota, Tokyo (JP); Takahiro Inoue, Tokyo (JP); Koji Tamaki, Fukuoka (JP); Shoichi Orita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 155 days.

(21) Appl. No.: 13/691,811

(22) Filed: Dec. 2, 2012

(65) Prior Publication Data

US 2013/0214748 A1  Aug. 22, 2013

(30) Foreign Application Priority Data

Feb. 17, 2012 (JP) ................................. 2012-032529

(51) Int. Cl.
*H03B 1/00* (2006.01)
*H03K 3/00* (2006.01)
*G05F 1/66* (2006.01)
*H03K 3/012* (2006.01)

(52) U.S. Cl.
CPC . *G05F 1/66* (2013.01); *H03K 3/012* (2013.01)

(58) Field of Classification Search
CPC .......... H03K 17/168; H03K 17/04123; H03K 17/0406; H03K 3/012
USPC ................................................ 327/108–112
See application file for complete search history.

(56) References Cited

U.S. PATENT DOCUMENTS

| 4,890,009 A | 12/1989 | Miyazaki et al. |
| 2005/0017788 A1 | 1/2005 | Inoue |
| 2007/0200613 A1 | 8/2007 | Ishikawa et al. |
| 2008/0122497 A1* | 5/2008 | Ishikawa et al. ............... 327/108 |
| 2009/0002054 A1 | 1/2009 | Tsunoda et al. |
| 2009/0066402 A1 | 3/2009 | Hiyama |
| 2010/0148846 A1 | 6/2010 | Hiyama |
| 2011/0220961 A1* | 9/2011 | Ninomiya ...................... 257/132 |

FOREIGN PATENT DOCUMENTS

| CN | 1723559 A | 1/2006 |
| CN | 100336303 C | 9/2007 |

(Continued)

OTHER PUBLICATIONS

An Office Action issued by the German Patent Office on Jan. 21, 2014, which corresponds to German Patent Application No. 10 2012 223 088.2 and is related to U.S. Appl. No. 13/691,811; with English language translation.

(Continued)

*Primary Examiner* — Jue Zhang
(74) *Attorney, Agent, or Firm* — Studebaker & Brackett PC

(57) ABSTRACT

A power device control circuit enters a gate driving signal into a gate terminal of a power device. The power device control circuit includes: a control signal input circuit that receives a power device control signal for control of the power device; a driving system control circuit connected to the control signal input circuit; a driving circuit with a plurality of driving systems, the driving circuit driving the power device in response to a driving circuit control signal received from the driving system control circuit; and a timer circuit that makes switching between the driving systems in response to the driving circuit control signal after elapse of a given period of time from receipt of a predetermined signal, specifically the power device control signal, thereby changing the driving power of the driving system control circuit to drive the power device.

14 Claims, 5 Drawing Sheets

(56) References Cited

FOREIGN PATENT DOCUMENTS

| CN | 101335484 A | 12/2008 |
|---|---|---|
| DE | 10 200 7002 544 A1 | 8/2007 |
| JP | H09-046201 A | 2/1997 |
| JP | 2000-232347 A | 8/2000 |
| JP | 2001-037207 A | 2/2001 |
| JP | 2004-023880 A | 1/2004 |
| JP | 2004-032409 A | 1/2004 |
| JP | 2004-265931 A | 9/2004 |
| JP | 2007-166655 A | 6/2007 |

OTHER PUBLICATIONS

An Office Action; "Notification of Reason(s) for Refusal," issued by the Japanese Patent Office on Dec. 2, 2014, which corresponds to Japanese Patent Application No. 2012-032529 and is related to U.S. Appl. No. 13/691,811; with English language partial translation.

The first Office Action issued by the Chinese Patent Office on Jun. 30, 2014, which corresponds to Chinese Patent Application No. 201210466744.3 and is related to U.S. Appl. No. 13/691,811; with English language translation.

The second Office Action issued by the Chinese Patent Office on Feb. 11, 2015, which corresponds to Chinese Patent Application No. 201210466744.3 and is related to U.S. Appl. No. 13/691,811; with English language partial translation.

The Third Office Action issued by the Chinese Patent Office on Aug. 20, 2015, which corresponds to Chinese Patent Application No. 201210466744.3 and is related to U.S. Appl. No. 13/691,811; with English language partial translation.

* cited by examiner

F I G . 4
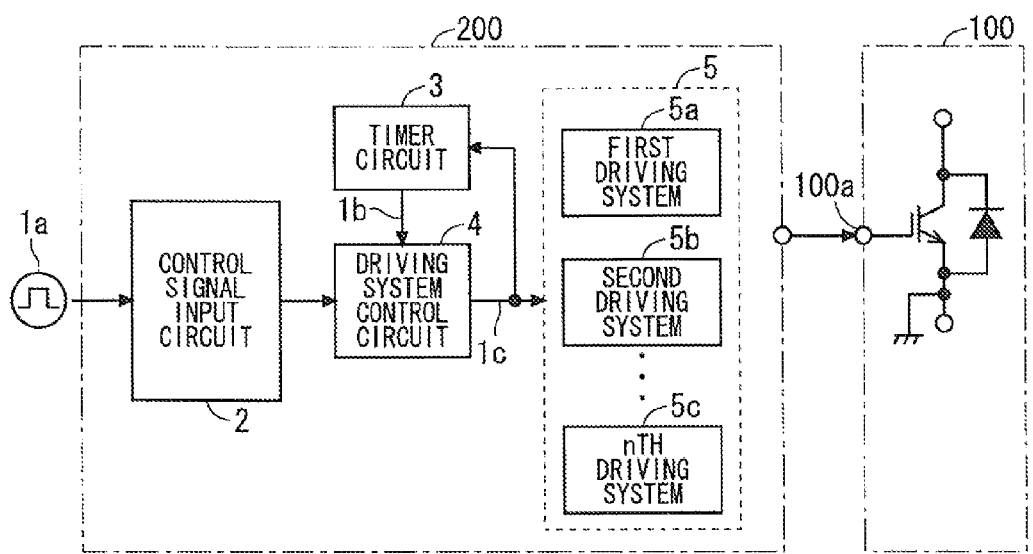

POWER DEVICE CONTROL CIRCUIT AND POWER DEVICE CIRCUIT

BACKGROUND OF THE INVENTION

1. Field of the Invention

The present invention relates to a power device control circuit and more specifically, relates to a power device control circuit that enters a gate driving signal into a gate terminal of a power device.

2. Description of the Background Art

For drive of a power device such as an IGBT, a power device control circuit controls a gate signal of the power device to perform switching of the power device.

During turn-on of the power device, transition from OFF condition to ON condition of the power device involves turn-on time. This turn-on time is time required for electrical charges to be accumulated in a gate-to-emitter capacitance and a gate-to-collector capacitance. In response to charging of these capacitances, a gate voltage is increased to reach a threshold voltage, thereby placing the power device in ON condition.

There is a period when a gate-to-emitter voltage is constant during increase of the gate-to-emitter voltage. This period is called a mirror period when the gate-to-collector is charged. After elapse of the mirror period, the gate-to-emitter voltage starts to increase again to reach the threshold voltage.

It is preferable that the turn-on time have the shortest possible length in consideration of energy loss caused by switching loss. Shortening the turn-on time necessitates shortening of the aforementioned mirror period. The power device can be turned on while the mirror period is shortened by increasing a current and a voltage to be applied to a gate.

However, increasing a current and a voltage to be applied to the gate during switching increases EMI (electromagnetic interference) noise, resulting in the fear of adverse effect on a peripheral device and the like.

As described above, it is difficult to achieve both suppression of switching loss and suppression of EMI noise. So, conventionally exerted control is intended to reduce EMI noise at the expense of switching loss.

According to known technique responsive to this problem, reduction in EMI noise and reduction in switching loss are both achieved by monitoring the gate voltage of a power device during switching of the power device, and changing a gate resistance in response to the rate of change of a gate-to-emitter voltage (see Japanese Patent Application Laid-Open No. 2007-166655). Japanese Patent Application Laid-Open No. 2007-166655 exerts control to change the resistance value of the gate resistance during a mirror period to a value lower than that determined at the start of turn-on. This causes a small current to flow into a gate in the initial stage of the turn-on to reduce noise such as EMI noise, while changing a current to flow into the gate to a large current in the mirror period when noise is less likely to be generated, thereby achieving both shortening of switching time and noise reduction.

In the instant specification, a gate-to-emitter voltage is hereinafter simply called a gate voltage.

The aforementioned technique of Japanese Patent Application Laid-Open No. 2007-166655 requires a circuit to monitor the gate voltage and a circuit to protect the previous circuit from a surge voltage and the like, leading to the problems of scale increase of a control circuit and cost increase.

Control to monitor the gate voltage and feed the gate voltage back to the control circuit involves a certain period of time for the feedback, making it impossible to respond to high-speed switching.

SUMMARY OF THE INVENTION

It an object of the present invention to provide a power device control circuit at low cost capable of making high-speed switching while achieving both suppression of switching loss and suppression of EMI noise.

The power device control circuit of the present invention is a power device control circuit that enters a gate driving signal into a gate terminal of a power device. The power device control circuit includes a control signal input circuit that receives a power device control signal for control of the power device, and a driving system control circuit connected to the control signal input circuit. The power device control circuit further includes a driving circuit with a plurality of driving systems, and a timer circuit. The driving circuit drives the power device in response to a driving circuit control signal received from the driving system control circuit. The timer circuit makes switching between the driving systems in response to the driving circuit control signal after elapse of a given period of time from receipt of a predetermined signal, thereby changing the driving power of the driving system control circuit to drive the power device.

According to the control realized by the present invention, during turn-on of the power device, the power device is driven with low driving power at the start of the turn-on. After arrival of a mirror period, a driving system is switched in response to the driving circuit control signal to drive the power device with higher driving power. This allows suppression of EMI noise without disregarding switching loss.

Further, driving power is changed by using the tinier circuit. So, monitoring of a gate voltage is not required to realize a circuit structure of a relatively small scale. Still further, not involving feedback control makes it possible to respond to high-speed switching.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a block diagram of a power device control circuit of a second preferred embodiment;

EMBODIMENT FOR CARRYING OUT THE INVENTION

First Preferred Embodiment

<Circuit Structure>

Figure 1:
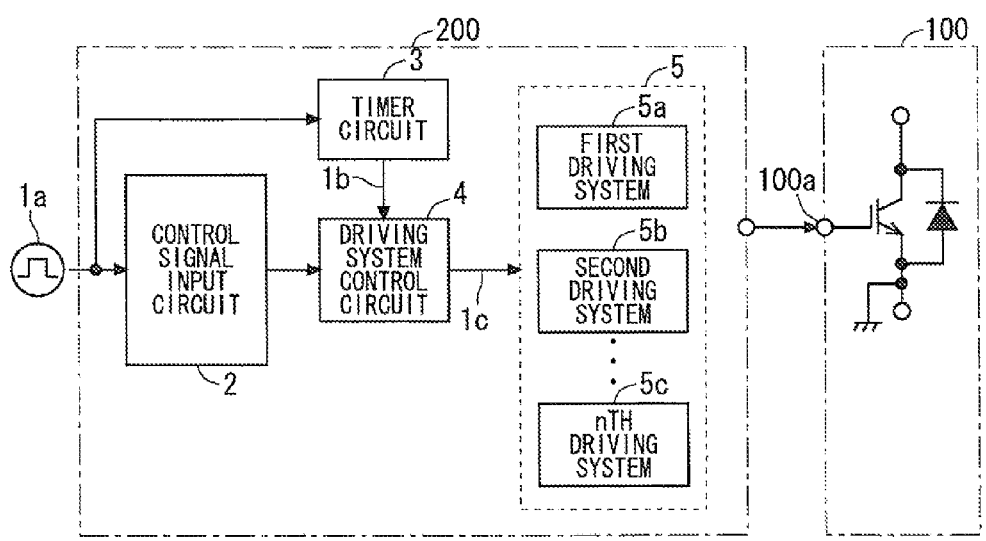
FIG. 1 is a block diagram of a power device control circuit of a first preferred embodiment.

FIG. 1 is a block diagram of a power device control circuit of a first preferred embodiment. A gate terminal 100*a* of a power device 100 targeted for control is connected to a power device control circuit 200. The power device 100 is an IGBT to which a free-wheel diode is connected, for example.

A control signal input circuit 2 that receives a power device control signal 1*a* applied from outside is connected to a driving system control circuit 4. A timer circuit 3 makes a count for time elapsed until a gate voltage reaches a mirror voltage in response to the power device control signal $1a$, and enters a timer signal $1b$ into the driving system control circuit 4.

A driving circuit 5 is connected to the driving system control circuit 4, and receives a driving circuit control signal $1c$ from the driving system control circuit 4. The output of the driving circuit 5 is entered into the gate terminal $100a$ of the power device 100.

The driving circuit 5 has a plurality of driving systems including first, second and $n^{th}$ driving systems $5a$, $5b$ and $5c$. These driving systems are switched in response to the driving circuit control signal $1c$.

Figure 2:
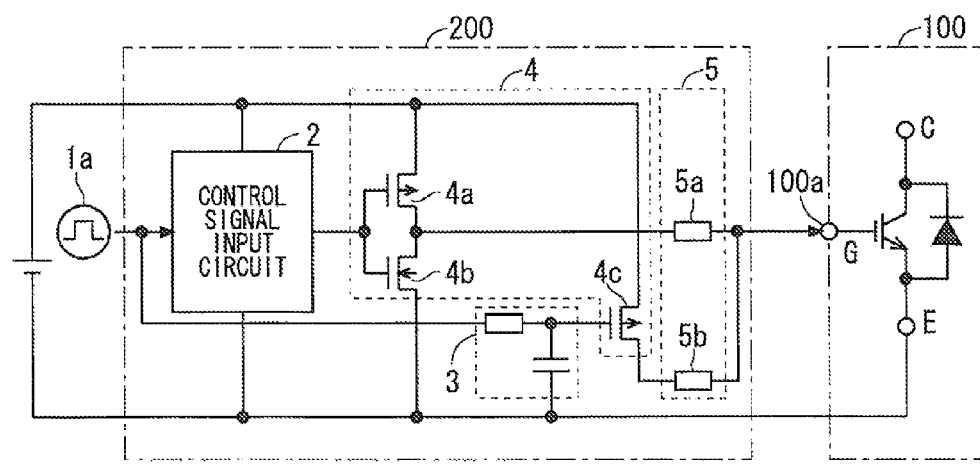
FIG. 2 is a circuit diagram of the power device control circuit of the first preferred embodiment.

FIG. 2 shows an exemplary circuit structure of the power device control circuit 200 of the first preferred embodiment. The driving system control circuit 4 is composed of an emitter-follower push-pull circuit including cascade connected MOSFETs $4a$ and $4b$ driven in response to the output of the control signal input circuit 2, and an MOSFET $4c$ driven in response to the timer signal $1b$ received from the timer circuit 3. The MOSFETs $4a$, $4b$ and $4c$ may be transistors of a different type.

The driving circuit 5 is composed of the first and second driving systems $5a$ and $5b$. The first driving system $5a$ is connected to the output of the push-pull circuit, specifically, to the emitter of the MOSFET $4a$ and the collector of the MOSFET $4b$. The second driving system $5b$ is connected to the emitter of the MOSFET $4c$. The first and second driving systems $5a$ and $5b$ each include a resistive element functioning as a driving element.

The timer circuit 3 is a time constant circuit composed of a resistive element and a capacitor. The resistance value of the time constant circuit and the capacitance of the capacitor are controlled such that time during which the timer circuit 3 makes a count becomes the same as time elapsed until a gate voltage reaches a mirror voltage.

<Operation>

Figure 3:
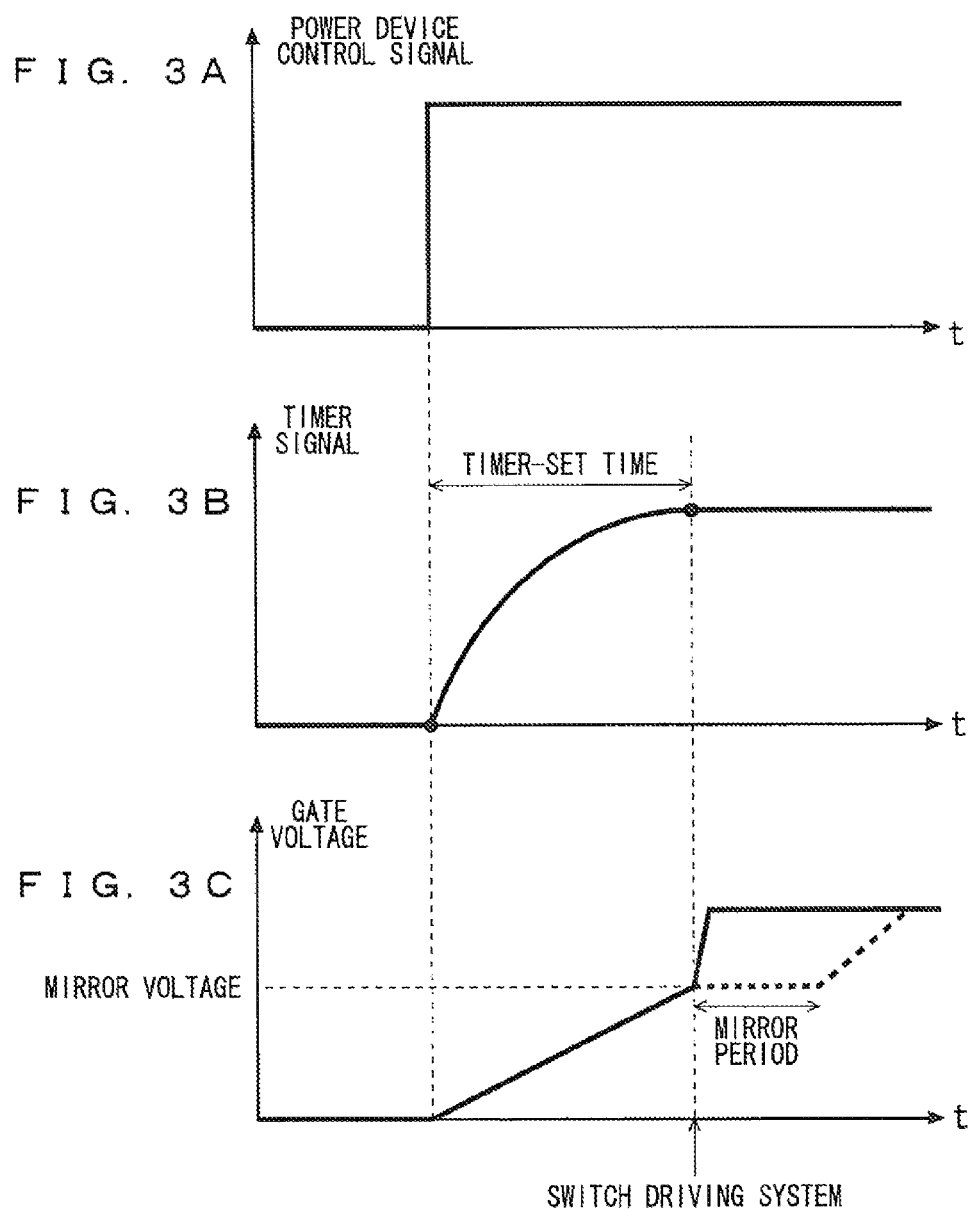
FIGS. 3A, 3B and 3C are views showing the operation of the power device control circuit of the first preferred embodiment.

FIGS. 3A to 3C show the sequence of operation of the power device control circuit 200 of the first preferred embodiment. Discussed first is change of a gate voltage indicated by dashed line of FIG. 3C occurring when the timer circuit 3 is not prepared and the power device 100 is driven only by the first driving system $5a$.

In response to entry of a power device control signal $1a$ into the control signal input circuit 2 (FIG. 3A), the control signal input circuit 2 turns on the MOSFET $4a$ in the driving system control circuit 4. Then, a bias voltage is supplied through the first driving system $5a$ to the gate terminal $100a$ of the power device 100. This charges the gate-to-emitter capacitance of the power device 100 to increase the gate voltage. The gate voltage is thereafter kept at a constant level for a certain period of time. This period is called a mirror period when the gate-to-collector capacitance of the power device 100 is charged. The gate voltage starts to increase again after elapse of the mirror period to turn on the power device 100. In this way, presence of the mirror period delays switching to generate switching loss.

In response, in the first preferred embodiment, the second driving system $5b$ is switched for driving by using the timer circuit 3. First, the power device control signal $1a$ is entered into the control signal input circuit 2 (FIG. 3A). At the same time, the power device control signal $1a$ is also entered into the timer circuit 3, thereby making the voltage of the capacitor of the timer circuit 3, namely the time constant circuit start to increase (FIG. 3B). The control signal input circuit 2 having received the power device control signal $1a$ turns on the MOSFET $4a$ in the driving system control circuit 4, thereby activating the first driving system $5a$. This generates the driving power of the first driving system $5a$ to apply a voltage to the gate terminal $100a$ of the power device 100, so the gate voltage starts to increase (FIG. 3C). The gate voltage reaches the mirror voltage, and at the same time, charging of the capacitor is completed in the timer circuit 3, namely in the time constant circuit after a lapse of time set by the timer circuit 3. As a result, the MOSFET $4c$ is turned on to activate the second driving system $5b$.

So, after switching of the second driving system $5b$, the power device 100 is driven with a higher voltage applied between the gate and the emitter of the power device 100 and generated by higher driving power of the first and second driving systems $5a$ and $5b$. Driving the power device 100 with higher driving power makes it possible to charge the gate-to-collector capacitance and the gate-to-emitter capacitance rapidly, thereby shortening the mirror period.

As a modification of the first preferred embodiment, the timer circuit 3 may be a circuit such as that of a microcontroller operating in response to a digital signal.

<Effect>

The power device control circuit 200 of the first preferred embodiment is a power device control circuit that enters a gate driving signal into the gate terminal $100a$ of the power device 100. The power device control circuit 200 includes: the control signal input circuit 2 that receives the power device control signal $1a$ for control of the power device 100; the driving system control circuit 4 connected to the control signal input circuit 2; the driving circuit 5 with the plurality of driving systems including first, second and $n^{th}$ driving systems $5a$, $5b$ and $5c$ that drives the power device 100 in response to the driving circuit control signal $1c$ received from the driving system control circuit 4; and the timer circuit 3 that makes switching between the driving systems in response to the driving circuit control signal $1c$ after elapse of a given period of time from receipt of a predetermined signal, specifically, the power device control signal $1a$, thereby changing the driving power of the driving system control circuit 4 to drive the power device 100.

So, at the start of turn-on, the power device 100 is driven with low driving power of the first driving system $5a$ to suppress generation of EMI noise. After arrival of a mirror period, a driving system is switched in response to the driving circuit control signal $1c$ to drive the power device 100 with high driving power achieved by a combination of the first and second driving systems $5a$ and $5b$. As a result, the mirror period is shortened to realize suppression of switching loss. Unlike Japanese Patent Application Laid-Open No. 2007-166655, the power device control circuit 200 of the first preferred embodiment does not perform feedback control by monitoring the gate voltage, making it possible to respond to high-speed switching. Further, unlike Japanese Patent Application Laid-Open No 2007-166655, the power device control circuit 200 of the first preferred embodiment does not require a circuit to monitor a gate voltage and a circuit to protect the previous circuit from a surge voltage and the like, making it possible to reduce cost. Additionally, time elapsed until a gate voltage reaches a mirror voltage depends on the characteristics of the power device control circuit 200. So, highly precise control is allowed by making this time agree with time during which the timer circuit 3 makes a count.

The power device control signal $1a$ is entered as the predetermined signal into the timer circuit 3 provided in the power device control circuit 200 of the first preferred embodiment. This allows the timer circuit 3 to make a count upon entry of the power device control signal $1a$ into the power device control circuit 200.

The timer circuit 3 provided in the power device control circuit 200 of the first preferred embodiment is a time constant circuit. Thus, the timer circuit 3 can be composed of a resistive element and a capacitor as shown in FIG. 2. This means that the timer circuit 3 can be formed of a small number of circuit elements, thereby achieving circuit scale reduction.

Each driving system provided in the power device control circuit 200 of the first preferred embodiment outputs a constant voltage. So, each driving system is capable of driving the power device 100 only with a resistive element. This achieves circuit scale reduction and cost reduction. This also achieves reduction in the number of components to allow reduction in rejection rate of a product.

In the power device control circuit 200 of the first preferred embodiment, all the driving systems include the same driving element or driving elements of the same type. The same driving element or driving elements of the same type in these driving systems are provided in these driving systems. So, understanding the characteristics of one driving element makes it possible to understand the characteristics of a different driving element. The driving systems may include parallel connected driving elements. In this case, understanding the characteristics of one driving element also makes it possible to understand the characteristics of a different driving element, and irregularities of the characteristics of the driving elements can be understood easily.

Further, to driving systems are provided in the power device control circuit 200 of the first preferred embodiment. Two driving systems are the minimum required to switch a driving system to change driving power. So, the circuit structure of the first preferred embodiment has the minimum required structure of the driving circuit 5. This achieves circuit scale reduction and cost reduction. This also achieves reduction in the number of components, thereby allowing reduction in rejection rate of a product.

As a modification of the power device control circuit 200 of the first preferred embodiment, the timer circuit 3 may be a circuit operating in response to a digital signal. Employing the circuit of a microcontroller and the like as the timer circuit 3 allows highly precise time control and realizes time setting more easily than a time constant circuit. Time setting is also achieved if the power device control circuit 200 is incorporated into an IC.

Second Preferred Embodiment

FIG. 4 is a block diagram of a power device control circuit 200 of a second preferred embodiment. In the first preferred embodiment, a signal to be entered into the timer circuit 3 is the power device control signal 1a. Unlike in the first preferred embodiment, the driving circuit control signal 1c is entered into the timer circuit 3. The circuit structure of the second preferred embodiment is the same as that of the first preferred embodiment in other respects, so the same structure will not be described repeatedly.

Like that of the first preferred embodiment, the timer circuit 3 of FIG. 4 is a time constant circuit. The timer circuit 3 is set in advance such that time during which the timer circuit 3 makes a count agrees with time elapsed until a gate voltage reaches a mirror voltage.

Figure 5:
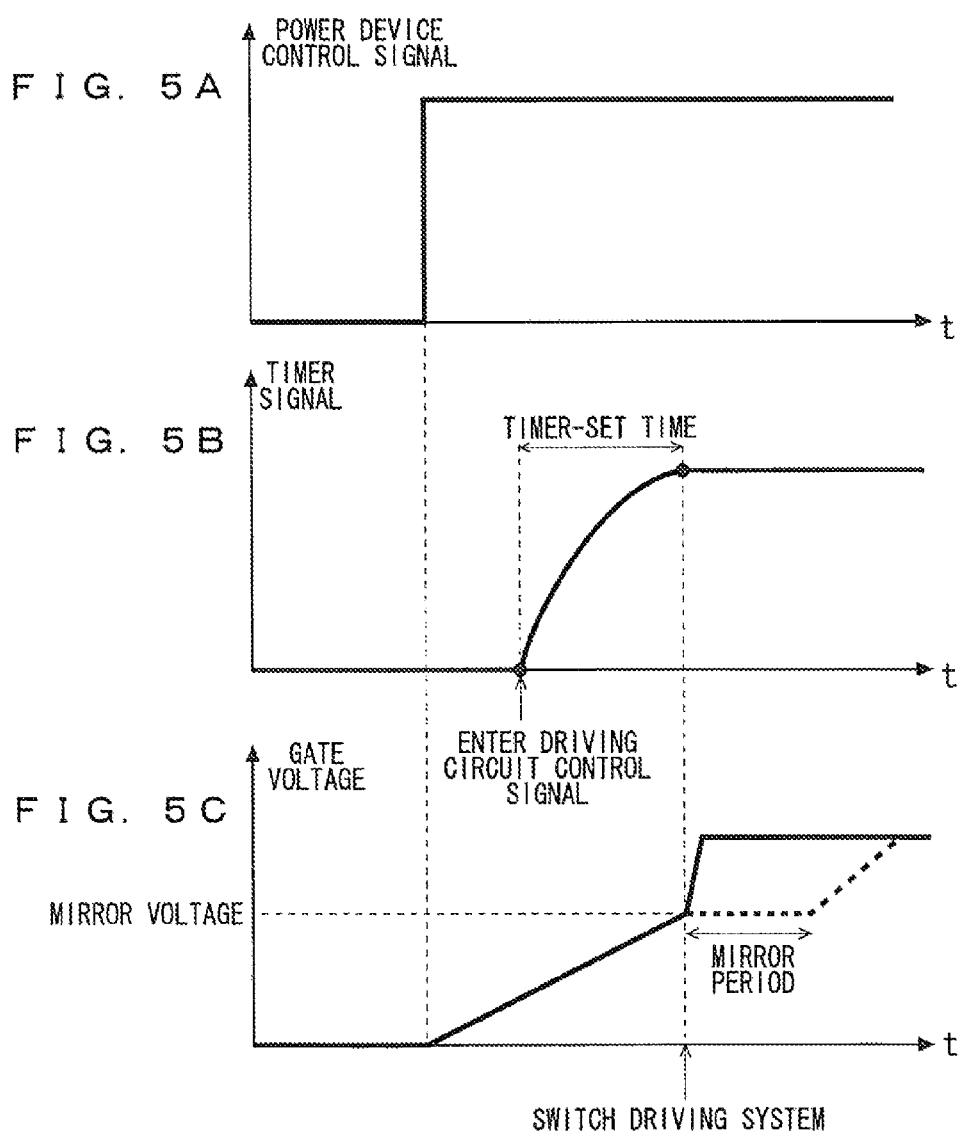
FIGS. 5A, 5B and 5C are views showing the operation of the power device control circuit of the second preferred embodiment.

FIGS. 5A to 5C show the sequence of operation of the power device control circuit 200 of the second preferred embodiment. In the first preferred embodiment (FIGS. 3A to 3C), the timer circuit 3 starts to make a count simultaneously with entry of the power device control signal 1a into the control signal input circuit 2. In the second preferred embodiment, the timer circuit 3 starts to make a count at a later time, specifically, at a time when the driving circuit control signal 1c is entered into the driving circuit 5. The operation of the second preferred embodiment is the same as that of FIGS. 3A to 3C in other respects, so the same operation will not be described repeatedly.

<Effect>

The driving circuit control signal 1c is entered, as the predetermined signal into the timer circuit 3 provided in the power device control circuit 200 of the second preferred embodiment. This makes time during which the timer circuit 3 makes a count shorter than that of the first preferred embodiment, making it possible to reduce the capacitance of a capacitor forming the time constant circuit. As a result, a circuit size can be reduced and cost can be reduced. Shortening time of counting reduces variations of the time of counting, making it possible to realize highly precise control.

Third Preferred Embodiment

Figure 6:
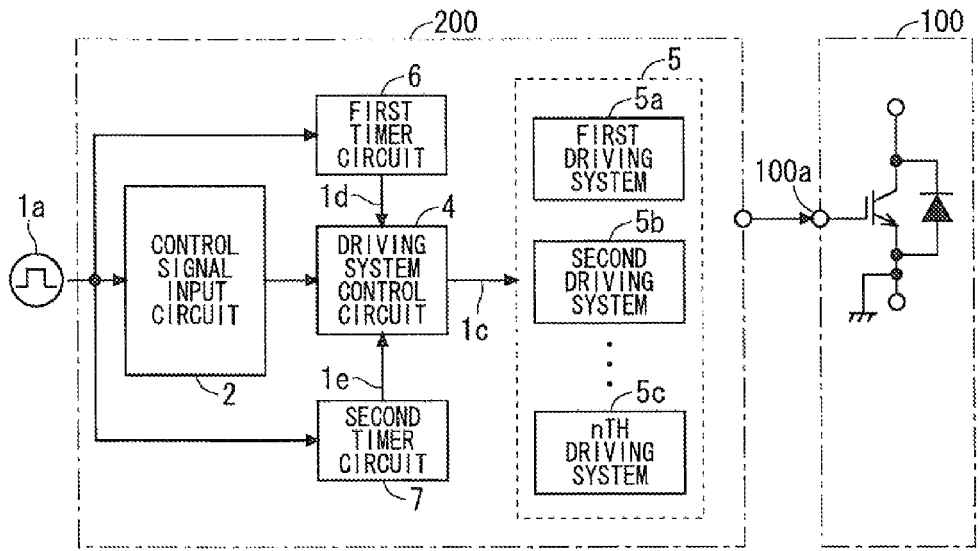
FIG. 6 is a block diagram of a power device control circuit of a third preferred embodiment.

FIG. 6 is a block diagram of a power device control circuit 200 of a third preferred embodiment. Unlike in the first and second preferred embodiments, two timer circuits including first and second timer circuits 6 and 7 are provided. Time during which the first timer circuit 6 makes a count and time during which the second timer circuit 7 makes a count are shifted to generate a time difference between time when a timer signal 1d is entered into the driving system control circuit 4 and time when a timer signal 1e is entered into the driving system control circuit 4. By using this time difference, the first, second and $n^{th}$ driving systems 5a, 5b and 5c can be switched in a stepwise manner.

A plurality of timer circuits is provided in the power device control circuit 200 of the third preferred embodiment. Thus, switching between the driving systems can be performed several times to allow change of driving power more smoothly than the first and second preferred embodiments, thereby controlling a gate voltage more ideally.

Fourth Preferred Embodiment

Figure 7:
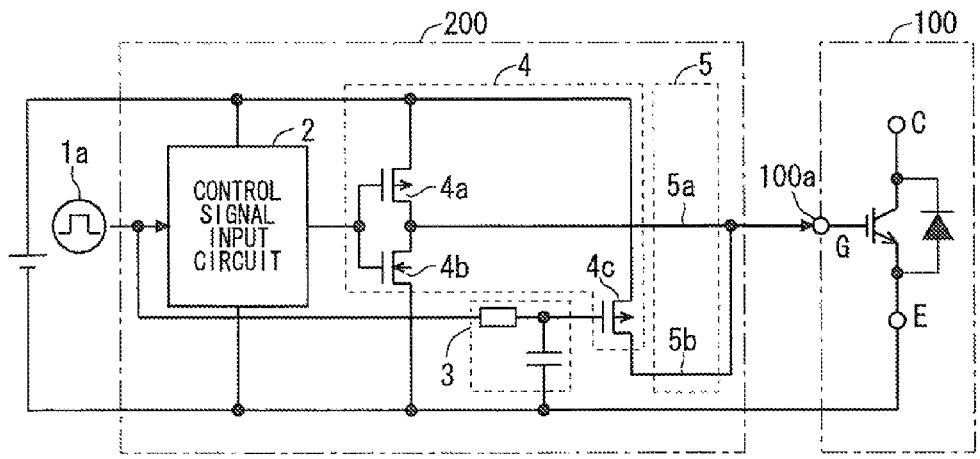
FIG. 7 is a circuit diagram of a power device control circuit of a fourth preferred embodiment.

FIG. 7 is a circuit diagram of a power device control circuit 200 of a fourth preferred embodiment. In the first preferred embodiment, a resistive element is connected to each driving system of the driving circuit 5 to output a constant voltage. The fourth preferred embodiment differs from the first preferred embodiment in that the first and second driving systems 5a and 5b produce a constant current output.

As shown in FIG. 7, driving elements are not connected to the first and second driving systems 5a and 5b. The first and second driving systems 5a and 5b are only shown as connecting lines in FIG. 7, and the output currents of the MOSFETs 4a and 4c are directly output to produce a constant current output. Meanwhile, a transistor such as an MOSFET may further be connected to each driving system. In this case, current amplification is performed to produce a constant current output.

Like in the first preferred embodiment, in the initial stage of turn-on, the power device 100 is driven only with the driving power of the first driving system 5a, specifically, with the output current of the MOSFET 4a. After elapse of a given period of time specifically, the moment a gate voltage reaches a mirror voltage, the timer circuit 3 turns on the MOSFET 4c to activate the second driving system 5b. Driving power is thereafter changed such that the power device 100 is driven with an output current generated by a combination of the first and second driving systems 5a and 5b. So, the power device 100 is turned on by following the same sequence of operation as that of the first preferred embodiment shown in FIG. 3C.
<Effect>

In the power device control circuit 200 of the fourth preferred embodiment, the first and second driving systems 5a and 5b produce a constant current output. So, the power device 100 is turned on in response to constant current driving, thereby charging the gate-to-emitter capacitance and the gate-to-collector capacitance of the power device 100 with a constant current. This changes a gate voltage linearly with respect to time, making it possible to control the gate voltage easily.

Fifth Preferred Embodiment

A power device control circuit of a fifth preferred embodiment is any one of the power device control circuits 200 described in the first to fourth preferred embodiments. The power device control circuit of the fifth preferred embodiment is incorporated entirely into an IC, or is separated and incorporated into a plurality of ICs.

The power device control circuit of the fifth preferred embodiment is incorporated entirely into an IC, or is separated and incorporated into a plurality of ICs. Incorporation of the power device control circuit into an IC reduces the circuit scale of the power device control circuit to achieve size reduction thereof. Incorporation of the power device control circuit into an IC reduces the number of components, allowing reduction in rejection rate of a product and reduction of manufacturing cost.

Sixth Preferred Embodiment

A power device circuit of a sixth preferred embodiment is composed of any one of the power device control circuits 200 described in the first to fourth preferred embodiments, and a power device 100 driven by one of the power device control circuits 200 of the first to fourth preferred embodiments. The power device circuit may be an IPM (intelligent power module), for example. Like in the first preferred embodiment, the power device 100 is composed of an IGBT and a free-wheel diode, for example.

As a modification of the power device circuit of the sixth preferred embodiment, the power device 100 may be an RC-IGBT (also called reverse conducting IGBT) made of any one of Si, SiC and GaN.

The power device circuit of the sixth preferred embodiment includes any one of the power device control circuits 200 described in the first to fourth preferred embodiments, and the power device 100 connected to one of the power device control circuits 200 of the first to fourth preferred embodiments. So, if the power device control circuit 200 and the power device 100 are arranged on the same circuit to form an IPM, for example, interconnect lines between the elements are shortened, thereby achieving noise reduction and reduction in the number of components.

The power device 100 of the sixth preferred embodiment is made of SiC or GaN. SiC and GaN have higher breakdown voltage than Si. This achieves size reduction of the power device 100, leading to size reduction of the power device circuit. Further, SiC and GaN allow operation under higher temperature and operation at higher speed than Si. So, if the power device circuit is an IPM, for example, the IPM itself or a device to house the IPM is allowed to have a simplified heat dissipation structure.

Additionally, the power device 100 of the sixth preferred embodiment further includes a diode made of SiC or GaN. SiC and GaN have higher breakdown voltage than Si. This achieves size reduction of the diode, leading to size reduction of the power device circuit.

As a modification of the power device circuit of the sixth preferred embodiment, the power device 100 is an RC-IGBT made of any one of Si, SiC and GaN. This achieves circuit scale reduction and easy assembly of the circuit compared to the case where a diode and a power device are used on different chips.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power device control circuit configured to provide a gate driving signal to a gate terminal of a power device, the power device control circuit comprising:
    a control signal input circuit configured to receive a power device control signal for control of said power device;
    a driving system control circuit connected to said control signal input circuit;
    a driving circuit with a plurality of driving systems, the driving circuit configured to drive said power device in response to a driving circuit control signal received from said driving system control circuit; and
    a plurality of timer circuits with each timer circuit configured to provide a respective output at a time different from any other timer circuit so as to cause the driving system control circuit to switch between said driving systems in response to said driving circuit control signal after elapse of a given period of time from receipt of a predetermined signal, thereby changing the driving power of said driving system control circuit to drive said power device, wherein
    said predetermined signal is the power device control signal or the driving circuit control signal,
    said power device control circuit switches between the driving systems in a stepwise manner using said plurality of timer circuits to change said driving power smoothly, and
    one of said timer circuits is used to switch between said driving systems at a start of a mirror period of the power device.

2. The power device control circuit according to claim 1, wherein
    said plurality of timer circuits includes a first timer circuit and a second timer circuit, and
    said driving circuit drives the power device with first driving power at a start of turn-on of the power device; at a start of the mirror period, said first timer circuit is used to switch between said driving systems so as to drive the power device with second driving power higher than said first driving power; and after a drive of said first driving power, said second timer circuit is used to switch between said driving systems so as to drive the power device with third driving power higher than said second driving power.

3. A power device circuit, comprising
    a power device control circuit configured to provide a gate driving signal to a gate terminal of a power device, and said power device connected to said power device control circuit, said power device control circuit including:

a control signal input circuit configured to receive a power device control signal for control of said power device;

a driving system control circuit connected to said control signal input circuit;

a driving circuit with a plurality of driving systems, the driving circuit configured to drive said power device in response to a driving circuit control signal received from said driving system control circuit; and a plurality of timer circuits with each timer circuit configured to provide a respective output at a time different from any other timer circuit so as to cause the driving system control circuit to switch between said driving systems in response to said driving circuit control signal after elapse of a given period of time from receipt of a predetermined signal, thereby changing the driving power of said driving system control circuit to drive said power device, wherein said predetermined signal is the power device control signal or the driving circuit control signal, said power device control circuit switches between the driving systems in a stepwise manner using said plurality of timer circuits to change said driving power smoothly, and one of said timer circuits is used to switch between said driving systems at a start of a mirror period of the power device.

4. The power device control circuit according to claim 2, wherein said timer circuit is a time constant circuit.

5. The power device control circuit according to claim 2, wherein said timer circuit is a circuit operating in response to a digital signal.

6. The power device control circuit according to claim 2, wherein said driving systems produce a constant voltage output.

7. The power device control circuit according to claim 2, wherein said driving systems produce a constant current output.

8. The power device control circuit according to claim 2, wherein said driving systems include the same driving element or driving elements of the same type.

9. The power device control circuit according to claim 2, wherein said driving systems include two driving systems.

10. The power device control circuit according to claim 2, wherein said power device control circuit is incorporated entirely into an IC, or is separated and incorporated into a plurality of ICs.

11. The power device circuit according to claim 3, wherein
said plurality of timer circuits includes a first timer circuit and a second timer circuit, and said driving circuit drives the power device with first driving power at a start of turn-on of the power device; at a start of the mirror period, said first timer circuit is used to switch between said driving systems so as to drive the power device with second driving power higher than said first driving power; and after a drive of said first driving power, said second timer circuit is used to switch between said driving systems so as to drive the power device with third driving power higher than said second driving power.

12. The power device circuit according to claim 11, wherein said power device is composed of an element made of SiC or GaN.

13. The power device circuit according to claim 11, wherein
said power device includes a diode, and
said diode is made of SiC or GaN.

14. The power device circuit according to claim 11, wherein said power device is an RC-IGBT made of any one of Si, SiC and GaN.

* * * * *